United States Patent [19]

Towndrow et al.

[11] 4,002,978
[45] Jan. 11, 1977

[54] MOVING-COIL ELECTRICAL INSTRUMENTS WITH RADIALLY SPACED ANNULAR AIR-GAPS

[75] Inventors: Percy Edwin Towndrow, Harrow; James Bernard Vousden, St. Albans, both of England

[73] Assignee: Smiths Industries Limited, London, England

[22] Filed: May 27, 1975

[21] Appl. No.: 581,247

[30] Foreign Application Priority Data

June 13, 1974 United Kingdom ............ 26330/74
Apr. 3, 1975 United Kingdom ............ 13680/75

[52] U.S. Cl. ............................................. 324/150
[51] Int. Cl.² ........................................ G01R 5/08
[58] Field of Search .......... 324/150, 151 R, 151 PB

[56] References Cited

UNITED STATES PATENTS

| | | | |
|---|---|---|---|
| 2,456,171 | 12/1948 | Bernreuter | 324/150 |
| 2,465,053 | 3/1949 | Baranowski | 324/150 |
| 2,537,221 | 1/1951 | Hickok | 324/150 |
| 2,798,200 | 7/1957 | Swan | 324/151 R X |
| 2,820,948 | 1/1958 | Kelly | 324/150 |
| 2,833,989 | 5/1958 | Nylander | 324/150 |
| 2,883,624 | 4/1959 | Millar | 324/150 |
| 2,973,480 | 2/1961 | Clark | 324/150 |
| 3,004,222 | 10/1961 | Knudsen | 324/150 |
| 3,111,623 | 11/1963 | Thomander | 324/150 X |
| 3,569,832 | 3/1971 | Marusek et al. | 324/150 |

FOREIGN PATENTS OR APPLICATIONS

| | | | |
|---|---|---|---|
| 462,920 | 3/1937 | United Kingdom | 324/150 |
| 627,327 | 8/1949 | United Kingdom | 324/150 |

*Primary Examiner*—Gerard R. Strecker
*Attorney, Agent, or Firm*—Pollock, VandeSande and Priddy

[57] ABSTRACT

A moving-coil electrical instrument in which an electric coil mounted for angular displacement about an axis embraces an annular core which is disposed between radially-spaced walls of a housing to define two radially-spaced, annular air-gaps through which extend the inner and outer limbs respectively of the coil. The inner air-gap is made shorter (in the direction of the lines of magnetic flux) than the outer air-gap, so that any change in the force induced into the outer limb of the coil, arising from, for example, radial misplacement of the core, is accompanied by a greater change in the force induced into the inner limb. Thus the difference in the radial distances from the axis of the inner and outer limbs is offset, and the changes in the torques induced into the inner and outer limbs balance one another. Alternatively, or additionally, the inner air-gap may be made wider (measured parallel to the respective limb of the coil) than the outer air-gap.

11 Claims, 8 Drawing Figures

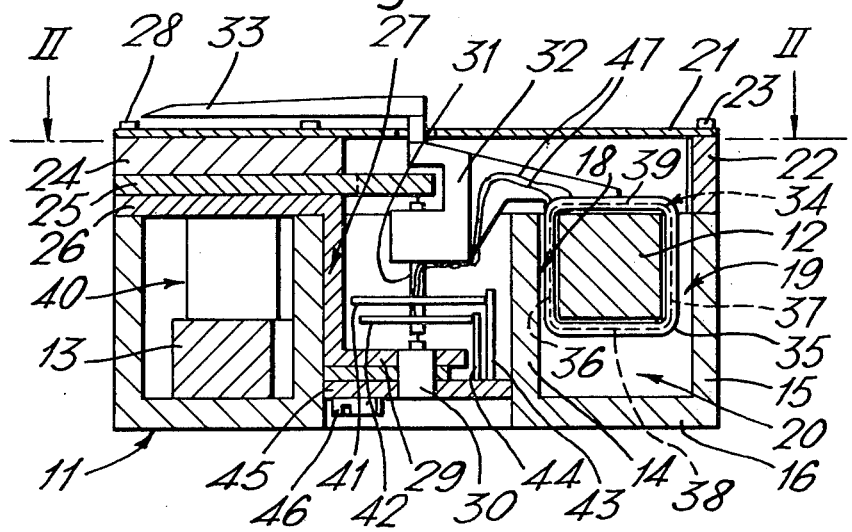
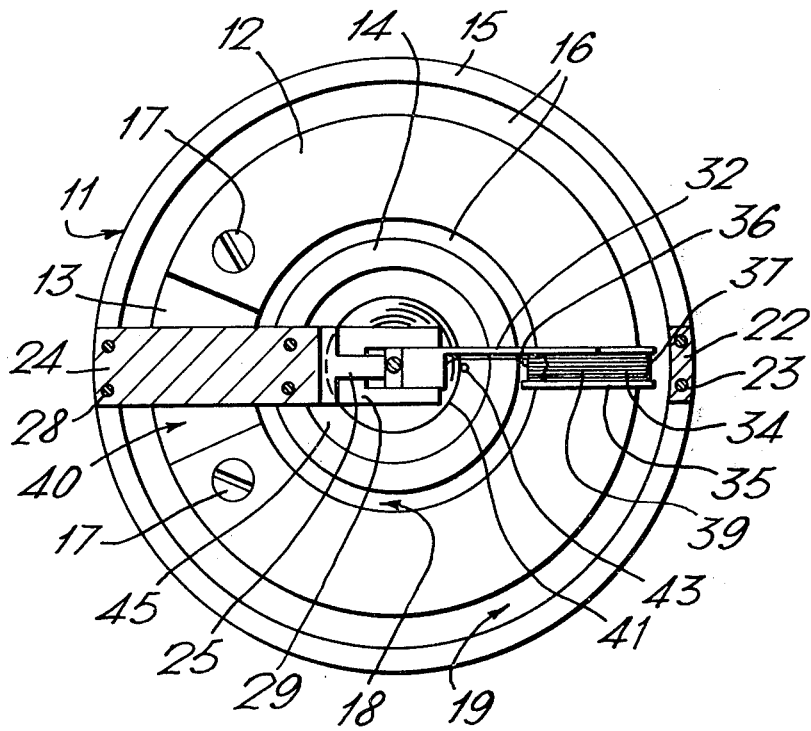

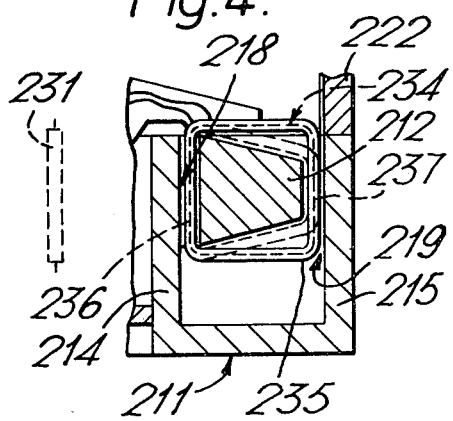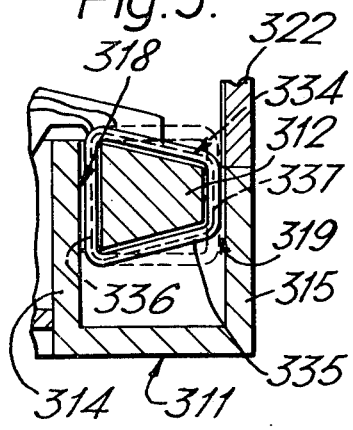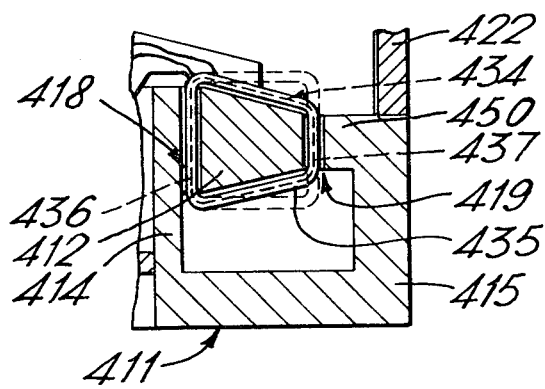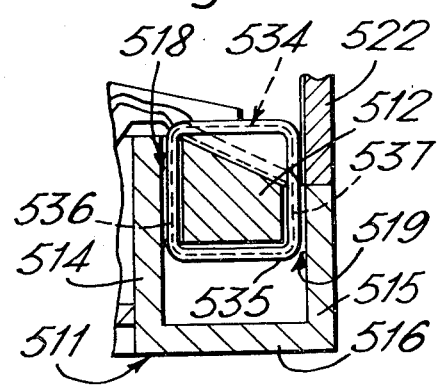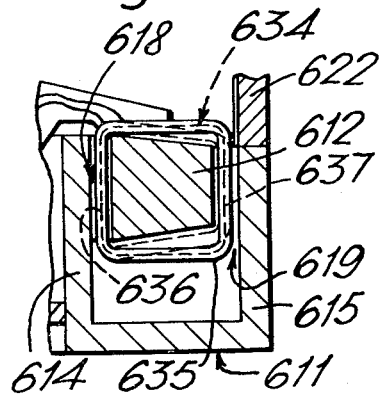

MOVING-COIL ELECTRICAL INSTRUMENTS WITH RADIALLY SPACED ANNULAR AIR-GAPS

This invention relates to moving-coil electrical instruments.

According to this invention there is provided a moving-coil electrical instrument comprising an electric coil which is mounted for angular displacement about an axis, and a magnetic circuit assembly having an annular core member embraced by the coil and a housing for the core member, the housing being spaced from the core member to define therewith two radially-spaced, annular air-gaps through which extend first and second portions respectively of the coil for electromagnetically-induced torque to be applied to the coil about the said axis, wherein the nominal dimensions of the air-gaps are selected such that, at any angular position of the coil, change in the component of the said torque induced into the first portion of the coil, arising from radial misplacement of the core member, is compensated by change of opposite sense and substantially equal magnitude in the component of the said torque induced into the second portion of the coil. It has been found that the provision of two such radially-spaced, annular air-gaps having nominal dimensions selected as aforesaid facilitates the production of the moving-coil instrument in large quantities having closely similar characteristics, since the need for careful control of dimensions during manufacture and assembly is thereby reduced. For example, if there is a small unintended eccentricity in the position of the core member relative to the housing, the effects of consequential changes in the lengths of the opposing sections of the annular air-gaps tend to compensate one another and thereby maintain the characteristics of the magnetic circuit in the instrument close to their required values.

In one aspect of the invention the inner one of the said annular air-gaps is shorter than the outer annular air-gap.

The cross-section of the core member, taken in a plane containing the said axis, may be rectangular.

In another aspect of the invention the inner one of the said annular air-gaps is wider than the outer annular air-gap.

The cross-section of the core member, taken in a plane containing the said axis, may be trapeziform.

The length of an air-gap is the linear dimension measured generally parallel to the lines of magnetic flux in the air-gap, while the width of the air-gap is the linear dimension measured generally parallel to, and in the path of, the portion of the coil extending through the air-gap.

This invention is especially applicable to moving-coil electrical instruments for providing an indication of the value of an electrical parameter against a scale extending through, for example, 230° or more, but is also applicable to instruments in which the scale extends through, say, 90°. Furthermore, the scale calibration of instruments according to the invention may be linear or non-linear.

A moving-coil electrical instrument according to this invention will now be described, by way of example, with reference to the accompanying drawings, in which:

FIG. 1 is a sectional side view of the instrument;

FIG. 2 is a sectional view of the instrument taken along the line II—II of FIG. 1;

FIGS. 4 to 8 are fragmentary sectional side views showing modified forms of the instrument of FIGS. 1 and 2.

Figure 3:
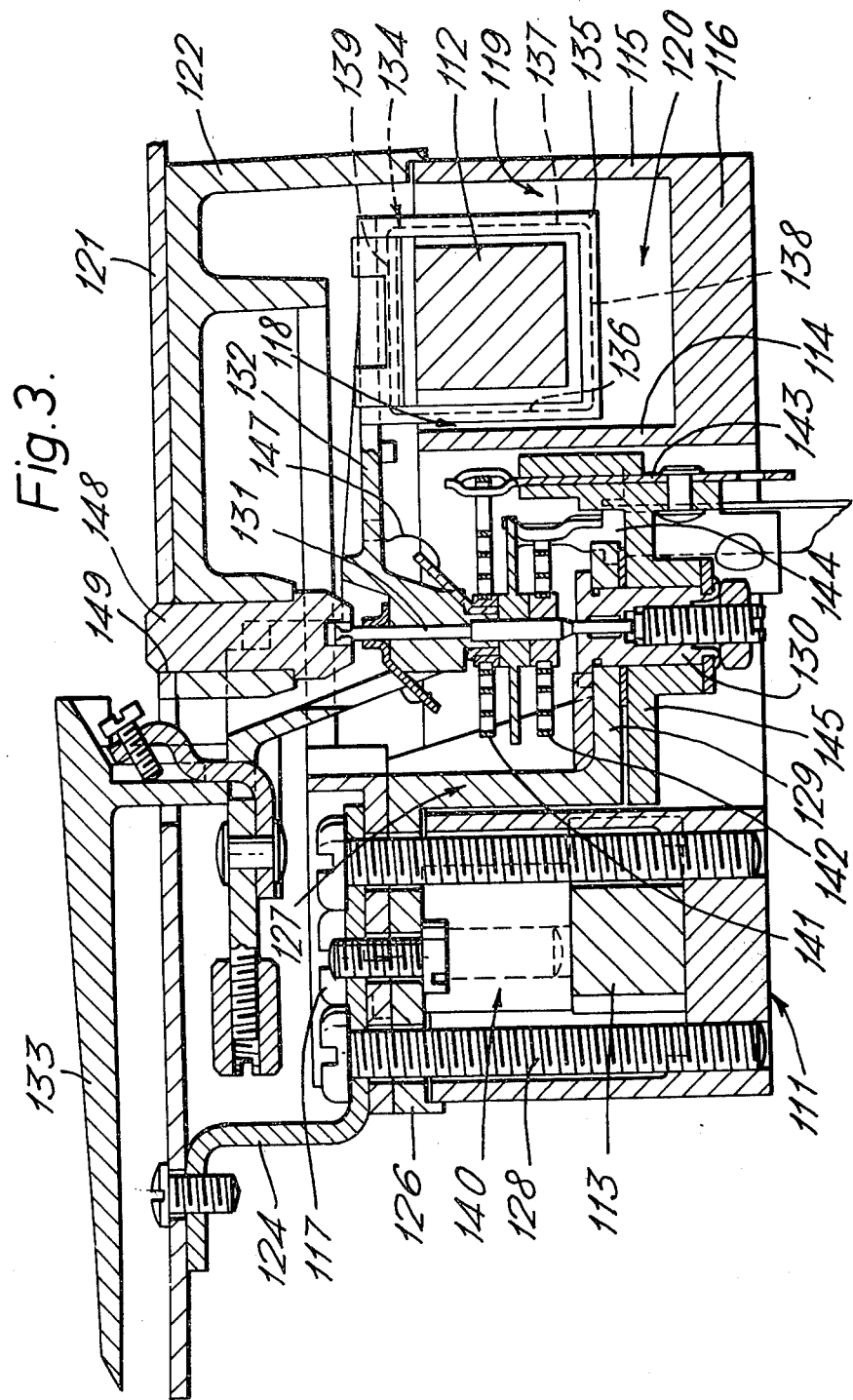
FIG. 3 is a sectional side view showing the instrument of FIGS. 1 and 2 in greater detail.

Referring to FIGS. 1 and 2, the moving-coil instrument includes a magnetic circuit assembly having an annular housing 11, an annular core 12 and an arcuate permanent magnet 13. The housing 11, which is of sintered iron, has inner and outer concentric walls 14 and 15 joined by an annular base section 16. The magnet 13 is seated on the base section 16 of the housing 11, between the walls 14 and 15, with its magnetic axis extending vertically. The core 12 is substantially square in cross-section, as shown in FIG. 1, and is disposed on the magnet 13 between, and concentrically with, the walls 14 and 15. The housing 11, the core 12 and the magnet 13 are secured together by screws 17. The core 12 defines, with the walls 14 and 15 and the base section 16, two radially-spaced, annular air-gaps 18 and 19 and an air-gap 20 respectively. The length of the magnet 13 is such as to leave these air-gaps 18 to 20 unobstructed over an angle of arc slightly greater than the angle of arc of the graduations on a scale plate 21 of the moving-coil instrument.

The scale plate 21 and a non-magnetic spacing pillar 22 are secured by screws 23 to the upper edge (as viewed in FIG. 1) of the outer wall 15, diametrically opposite the magnet 13. Above the magnet 13, the scale plate 21 and a spacing plate 24 are secured, together with a plate 25 and an upper limb 26 of a bracket 27, by screws 28 to the upper edges of the walls 14 and 15. A lower limb 29 of the bracket 27 carries a jewel bearing 30 supporting the lower end of a spindle 31 which is disposed along the axis of the housing 11. The upper end of the spindle 31 is journalled in the plate 25. The spindle 31 supports a coil carrier 32 which projects over the inner wall 14 and which carries a pointer 33 and a coil 34 wound on square aluminum former 35 embracing the core 12. Thus, an inner limb 36, an outer limb 37 and a lower limb 38 of the coil 34 extend through, respectively, the air-gaps 18, 19 and 20, while an upper limb 39 of the coil 34 lies above the upper surface of the core 12. The core 12 has a gap 40 to permit the coil 34 and the former 35 to be positioned on the core 12 during assembly of the moving-coil instrument.

The spindle 31 also carries two spiral hair-springs 41 and 42, the outer ends of which are anchored to pins 43 and 44 mounted upon a spring adjuster plate 45. The adjuster plate 45 is clamped to the underside of the lower limb 29 of the bracket 27 by a screw 46. Electric current is supplied through the pins 43 and 44 and the hair-springs 41 and 42 to wires 47 of the coil 34.

The housing 11 and the core 12 constitute pole-pieces for the magnet 13, and the coil 34 is thus situated in a magnetic field extending across the air-gaps 18 to 20. When the coil 34 is energized, the torque induced by the electromagnetic interaction of this magnetic field with the current flowing in the coil 34 causes the coil 34 to move around the core 12 until the electromagnetically-induced torque equals the opposing mechanical torque supplied by the hair-springs 41 and 42.

If the moving-coil instrument is to be produced in large quantities without separate calibration (other than simple zero-adjustment) of each individual instrument, the relationship between, on the one hand, the extent of angular displacement of the coil 34 (and thus of the pointer 33 relative to the scale plate 21) and, on the other hand, the magnitude of the current flowing in the coil 34 must be repeatable from one instrument to another with a high degree of accuracy. Thus the torque induced at each point around the arc of movement of the coil 34 must be as consistent as possible from one instrument to the next.

The magnitude of the induced torque acting on any particular elemental section of the coil 34 depends upon, among other things, the radial distance of that section from the spindle 31 and the flux density of the magnetic field adjacent that section. The flux density itself depends upon the length of the air-gap in which that section of the coil 34 is situated. Thus, the magnitude of the induced torque acting on that section of the coil 34 varies with the degree of concentricity of the housing 11, the core 12 and the spindle 31; and the desired uniformity of the induced-torque characteristic from one instrument to the next is ultimately limited by the tolerances involved in manufacturing and assembling the housing 11, the core 12, and the coil 34 and its associated components.

However, it has been found that the provision of the two radially-spaced, annular air-gaps 18 and 19 substantially concentric with the spindle 31, and the appropriate selection of their dimensions, reduces substantially variations of the induced-torque characteristic from one instrument to another.

Eccentricities of the housing 11 and the core 12 are compensated because the sum of the lengths of the air-gaps 18 and 19 is determined by the spacing of the walls 14 and 15 of the housing 11, and by the width of the core 12, and both of these dimensions are readily maintained constant and accurate. If, for example, the core 12 is displaced such that the air-gap 18 has a length greater than the nominal value in any region, the air-gap 19 must consequently be shorter than its nominal length in that same region. Thus, the decrease in magnetic flux density in that region of the air-gap 18 is accompanied by an increase in magnetic flux density in the air-gap 19, and the reduction in the torque acting on the inner limb 36 of the coil 34 is compensated at least in part by the increase in the torque acting on the outer limb 37 of the coil 34.

Although equal and opposite changes in flux density in the air-gaps 18 and 19 would produce equal and opposite changes in the forces acting on the inner and outer limbs 36 and 37 of the coil 34, the consequent changes in the torques acting on these inner and outer limbs 36 and 37 would not be equal, since the inner and outer limbs 36 and 37 are at different radial distances from the spindle 31. However, it has been found that selection of an appropriate ratio of the dimensions of the air-gaps 18 and 19 can significantly reduce this imbalance. The nominal force acting upon the outer limb 37 is made less than that acting upon the inner limb 36, by making the air-gap 19 longer (and/or narrower) than the air-gap 18. Thus, in the event of eccentricity of the core 12 relative to the housing 11, the change in the force acting on the inner limb 36 will be accompanied by a smaller change in the force acting on the outer limb 37. This difference in force change offsets the difference in radial distances, so that the resulting changes in the torques acting on the limbs 36 and 37 closely balance each other.

It is believed that, for parallel air-gaps 18 and 19, the best ratios for the lengths and widths of the air-gaps 18 and 19 for providing optimum compensation the arrangement of this invention may be found from the formula $$(c_o/c_i)(g_i/g_o)^2 = r_i/r_o \qquad 1.$$

where
$c_i$ is the width of the air-gap 18 in the path of the inner limb 36 of the coil 34;
$c_o$ is the width of the air-gap 19 in the path of the outer limb 37 of the coil 34;
$g_i$ is the length of the air-gap 18;
$g_o$ is the length of the air-gap 19;
$r_i$ is the distance between the spindle 31 and the inner limb 36; and
$r_o$ is the distance between the spindle 31 and the outer limb 37.

However, it is envisaged that these ratios may vary over quite a wide range to suit individual circumstances.

Formula (1) is derived from the following equation, which is an approximate expression for the torque acting on the coil 34 in terms of the components acting on the limbs 36 and 37:

$$\text{Torque} = aK(c_i r_i/g_i + c_o r_o/(D-g_i)) \qquad 2.$$

where $a$ and K are constants related to, respectively, the amp-turns of the coil 34 and the magnetomotive force of the magnet 13; and $$D = g_i + g_o.$$

Equation (2) is differentiated with respect to $g_i$, and the resulting equation is set equal to zero (for minimum change in torque) and solved for $g_i$ to obtain formula (1).

For the case in which the air-gaps 18 and 19 are of equal width, as shown in FIGS. 1 and 2, formula (1) simplifies to $$g/g_i = \sqrt{(r_o/r_i)} \qquad 3.$$

An alternative way of expressing this is $$g_i = D(1 - \sqrt{W})/(1 - W) \qquad 4.$$

where $W = r_o/r_i$.

Formula (4) is found by substituting $(D - g_i)$ for $g_o$ in formula (3) and solving for $g_1$. For a ratio of 1:2 for the nominal distances from the spindle 34 of the inner and outer limbs 36 and 37, the best ratio for the lengths of the air-gaps 18 and 19 is $1:\sqrt{2}$.

Eccentricity in the mounting of the coil 34 (which is of secondary importance compared to eccentricity of the housing 11 and the core 12) is compensated in the arrangement shown in FIGS. 1 and 2 by making the air-gap 20 much longer than the air-gaps 18 and 19, so that the maximum magnetic flux density occurs in the air-gaps 18 and 19. Any radial displacement of the coil 34 relative to the core 12, due to eccentricity, will not result in any change in the torque acting on the inner and outer limbs 36 and 37 of the coil 34, since the displacement is parallel to the magnetic flux paths in the air-gaps 18 and 19 and there is thus no change in the flux density associated with the inner and outer limbs 36 and 37. The torque acting on the lower 38 of the coil 34 will be affected, since the displacement is transverse to the magnetic flux paths in the air-gap 20, and each section of the lower limb 38 is moved into a different part of the magnetic field. However, because the flux density in the air-gap 20 is relatively low in magnitude, the overall effect of the change in the torque acting on the lower limb 38 is minimized. An additional consequence of making the air-gap 20 relatively long is that the effect of any vertical misalignment of the core 12 is also minimized.

Besides improving the uniformity of the moving-coil instrument without the need for uneconomically high standards of accuracy in assembly, the construction shown in the drawings has the advantage that almost all of the magnetic flux between the housing 11 and the core 12 crosses the coil 34, since three limbs (36, 37 and 38) of the coil 34 are interposed between the housing 11 and the core 12. This results in high efficiency of utilization of the mgnetic field of the magnet 13, and improved sensitivity of the moving-coil instrument. In addition, the damping effect of eddy currents in the aluminum former 35 is increased, and less aluminum is needed to obtain a desired level of damping. Thus the former 35 can be reduced in size and weight.

FIG. 3 shows the instrument of FIGS. 1 and 2 in greater detail. For clarity and ease of comprehension, corresponding parts have been given corresponding reference numerals, but increased by one hundred in FIG. 3. Referring to FIG. 3, the upper end of the spindle 131 is journalled in a bearing 148, and the scale plate 121 has an aperture 149 in which the upper end of the bearing 148 is a close fit. By this means the concentricity of the scale plate 121 and the spindle 131 assured.

As mentioned earlier, the desired optimum compensation for eccentricity of the core 12 may also be obtained by appropriate selection of the widths of the air-gaps 18 and 19. Thus, referring to FIG. 4, the core 212 has an outwardly-tapering trapeziform cross-section along most of its circumference (but with rectangular cross-section ends to aid alignment with the housing 211). The difference in nominal magnitude of the forces acting on the inner and outer limbs 236 and 237 of the coil 234 is in this case provided by the difference in the effective lengths of the limbs 236 and 237 along which they are permeated by magnetic flux. For the case in which the air-gaps 218 and 219 are of equal length, as shown in FIG. 4, formula (1) simplifies to $$c_o/c_i = r_i/r_o \qquad 5.$$

Thus, for a ratio of 1:2 for the nominal distances from the spindle 231 of the inner and outer limbs 236 and 237, the best ratio for the widths of the air-gaps 218 and 219 is 2:1.

A number of modifications may be made to the instrument shown in FIG. 4. The coil 234 and the former 235 may be made in a trapeziform shape corresponding to the cross-section of the core 212, as shown in dotted lines in FIGS. 4, 7 and 8 and in full lines in FIGS. 5 and 6.

FIG. 5 shows an arrangement in which, instead of the inner and outer walls 314 and 315 being of equal height, the outer wall 315 projects only as far as the upper edge of the outer face of the core 312. In a further modification, shown in FIG. 6, the outer wall 415 is provided with an inwardly-directed flange 450 which has the same vertical dimension as the outer face of the core 412 and which concentrates the magnetic flux in the air-gap 419. Referring to FIG. 7, the lower face of the core 512 is parallel to the base section 516, instead of being inclined as shown in the other figures. The cores 412, 512 of FIGS. 6 and 7, in particular, could be of rectangular rather than trapeziform cross-section.

The instrument shown in FIG. 8 has its air-gap 618 both shorter and wider than the air-gap 619. Thus, the air-gap 619 in FIG. 8 is wider than the air-gap 319 in FIG. 5, but optimum compensation is still obtained because the air-gap 619 is also longer than in FIG. 5. Formula (1) is also applicable to the configuration shown in FIG. 8.

It is envisaged that configurations other than those shown could also be used. Thus, for example, the air-gaps 18 and 19 could be convergent rather than parallel. The core 12 may have virtually any cross-sectional shape desired.

The magnet 13 could be placed in either of the air-gaps 18 and 19 instead of in the air-gap 20. This would permit the air-gap 20 to be made shorter, and the instrument more compact. If the magnet 13 were modified in this manner, the housing 11 could have a cover above the coil 34, the coil carrier 32 being modified to protrude through a slot between the cover and the inner wall 14 of the housing 11. This cover would, together with the upper surface of the core 12, define a fourth air-gap through which the upper limb 39 of the coil 34 would extend, enhancing the efficiency of utilization of the magnetic flux of the magnet 13. The addition of the cover would also permit improved compensation for vertical misalignment (or weave) of the core 12 by means of the combined effect of the fourth air-gap and the air-gap 20. In such a case, these air-gaps would be made nominally equal in length. Although reducing the length of the air-gap 20 would tend to accentuate errors due to eccentric mounting of the coil 34, such errors are in any event of only secondary importance. The gap 40 in the core 12 may, if desired, be plugged after assembly of the moving-coil instrument.

We claim:

1. A moving-coil electrical instrument comprising an electric coil having first and second portions, means mounting the electric coil for angular displacement about an axis, a magnetic circuit assembly comprising a housing of magnetic material having inner and outer radially-spaced, substantially annular surfaces, an annular core member of magnetic material, and means mounting the core member between the said inner and outer housing surfaces to define, between the said inner housing surface and the core member, and between the said outer housing surface and the core member, respective inner and outer radially-spaced annular air-gaps, the coil mounting means being so arranged that the coil embraces the core member with its said first and second portions extending through respective ones of the air-gaps to cause electromagnetically-induced torque to be applied to the coil about the said axis, and the nominal dimensions of said radially-spaced annular air-gaps being unequal and so related to one another that, at any angular position of the coil, a change in the component of the said torque induced into the said first portion of the coil, arising from radial displacement of the core member, is compensated by change of opposite sense and substantially equal magnitude of the said torque induced into the said second portion of the coil.

2. An instrument according to claim 1, wherein the cross-section of the core member, taken in a plane containing the said axis, is rectangular.

3. An instrument according to claim 1, wherein the cross-section of the core member taken in a plane containing the said axis, is trapeziform.

4. An instrument according to claim 1 wherein the dimensions of the said housing surfaces, measured parallel to the said axis, are equal.

5. An instrument according to claim 1 wherein the dimension of the outer one of the said housing surfaces, measured parallel to the said axis, is less than that of the inner housing surface.

6. An instrument according to claim 1 including a scale plate provided with an aperture and an arcuate scale centered on the axis of the aperture, the said means mounting the coil comprising bearing means located in the said aperture and a spindle journalled in the said bearing means.

7. The instrument of claim 1 wherein the dimension of said inner one of the said annular air-gaps measured generally parallel to the lines of magnetic flux to be established in the air-gap is less than the corresponding dimension of said outer annular air-gap.

8. The instrument of claim 1 wherein the dimension of the inner one of the said annular air-gaps measured generally parallel to, and in the path of, the portion of the coil extending through said inner air-gap is greater than the corresponding dimension of the outer one of said annular air-gaps.

9. The instrument of claim 1 wherein the housing has a third substantially annular surface which extends between, and generally normal to, the said inner and outer housing surfaces, said core member being so mounted by its said mounting means as to define, between the said third housing surface and the core member, a third air-gap which connects said radially-spaced annular air-gaps and through which a third portion of said coil extends, the dimension of the said third air-gap measured generally parallel to the lines of magnetic flux to be established in said third air-gap being greater than the corresponding dimension of either of said annular air-gaps.

10. A moving-coil electrical instrument comprising an electric coil, means mounting the electric coil for annular displacement about an axis, and a magnetic circuit assembly comprising a housing of magnetic material having inner and outer radially-spaced, substantially annular surfaces, an annular core member of magnetic material, and means mounting the core member between the said inner and outer housing surfaces to define, between the said inner housing surface and the core member, and between the said outer housing surface and the core member, respective inner and outer radially-spaced annular air-gaps, said means mounting the coil being so arranged that the coil embraces the core member and extends through both of said radially-spaced annular air-gaps, the dimension of said inner annular air-gap measured generally parallel to the lines of magnetic flux to be established in said inner air-gap being less than the corresponding dimension of said outer annular air-gap, such that at any angular position of the coil, a change in the component of the torque induced into the part of the coil in one of said air gaps, arising from radial displacement of the core member, is compensated by change of opposite sense and substantially equal magnitude of the torque induced into the part of the coil in the other of said air gaps.

11. A moving-coil electrical instrument comprising an electric coil, means mounting the electric coil for angular displacement about an axis, and a magnetic circuit assembly comprising a housing of magnetic material having inner and outer radially-spaced, substantially annular surfaces, an annular core member of magnetic material, and means mounting the core member between the said inner and outer housing surfaces to define, between the said inner housing surface and the core member, and between the said outer housing surface and the core member, respective radially-spaced inner and outer annular air-gaps, the means mounting the coil being arranged such that the coil embraces the core member and extends through both of said annular air-gaps, and the dimension of said inner annular air-gap measured generally parallel to, and in the path of, the portion of the coil extending through said inner air-gap being greater than the corresponding dimension of said outer annular air-gap, such that at any angular position of the coil, a change in the component of the torque induced into the part of the coil in one of said air gaps, arising from radial displacement of the core member, is compensated by change of opposite sense and substantially equal magnitude of the torque induced into the part of the coil in the other of said air gaps.

* * * * *